United States Patent … US 9,768,892 B1
Bradley … Sep. 19, 2017

(54) PULSE MODULATED PASSIVE INTERMODULATION (PIM) MEASURING INSTRUMENT WITH REDUCED NOISE FLOOR

(71) Applicant: ANRITSU COMPANY, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 84 days.

(21) Appl. No.: 14/673,408

(22) Filed: Mar. 30, 2015

(51) Int. Cl.
*H04B 17/00* (2015.01)
*G01R 31/00* (2006.01)
*G01R 31/11* (2006.01)
*H04B 17/17* (2015.01)
*H04B 17/29* (2015.01)
*G01R 31/12* (2006.01)
*G01R 31/08* (2006.01)

(52) U.S. Cl.
CPC ....... *H04B 17/0085* (2013.01); *G01R 31/001* (2013.01); *G01R 31/11* (2013.01); *H04B 17/17* (2015.01); *H04B 17/29* (2015.01); *G01R 31/088* (2013.01); *G01R 31/1272* (2013.01)

(58) Field of Classification Search
CPC .... H04B 17/17; H04B 17/0085; H04B 17/29; H04B 17/001; G01R 31/001; G01R 31/11; G01R 31/083; G01R 31/085; G01R 31/088; G01R 31/1272
USPC ....................................................... 324/520
See application file for complete search history.

(56) References Cited

U.S. PATENT DOCUMENTS

| | | |
|---|---|---|
| 2,594,328 A | 4/1952 | Marchetti |
| 4,274,047 A | 6/1981 | Hecken |
| 4,991,098 A | 2/1991 | Dantzler |
| 5,479,090 A | 12/1995 | Schultz |
| 5,513,094 A | 4/1996 | Stanley |
| 5,602,709 A | 2/1997 | Al-Dabbagh |
| 5,706,010 A | 1/1998 | Franke |

(Continued)

FOREIGN PATENT DOCUMENTS

| | | |
|---|---|---|
| WO | 03030416 | 4/2003 |
| WO | 2004017516 | 2/2004 |
| WO | 2012009757 | 1/2012 |

OTHER PUBLICATIONS

Bell, et al., Range to Fault Technology, 2011, 10 pages, Kaelus.

(Continued)

*Primary Examiner* — Jermele M Hollington
*Assistant Examiner* — Christopher McAndrew
(74) *Attorney, Agent, or Firm* — Tucker Ellis LLP

(57) ABSTRACT

In an embodiment, a method for measuring passive intermodulation (PIM) associated with a device under test (DUT) includes generating a test signal using a measuring instrument and obtaining measurements of PIM for the DUT. The test signal comprises two or more tones each amplified to a target output power by a respective amplifier according to a duty cycle. Measurements are obtained by the measuring instrument during an active portion of each duty cycle over a sweep of frequencies. PIM is calculated for the DUT by averaging a plurality of measurements obtained for each frequency from the sweep of frequencies. The duty cycle is determined based on the target output power.

17 Claims, 2 Drawing Sheets

(56) References Cited

U.S. PATENT DOCUMENTS

| | | | |
|---|---|---|---|
| 5,729,145 A | 3/1998 | Blades | |
| 5,973,568 A | 10/1999 | Shapiro | |
| 5,994,905 A | 11/1999 | Franchville | |
| 6,144,692 A | 11/2000 | Beck | |
| 7,068,096 B2 | 6/2006 | Chu | |
| 7,103,114 B1 | 9/2006 | Lapierre | |
| 7,469,190 B2 | 12/2008 | Bickel | |
| 7,511,472 B1 | 3/2009 | Xia et al. | |
| 7,598,714 B2 | 10/2009 | Stanley | |
| 7,629,764 B2 | 12/2009 | Shoemaker | |
| 7,696,850 B2 | 4/2010 | Stanford | |
| 7,696,940 B1 | 4/2010 | MacDonald | |
| 8,058,880 B2 | 11/2011 | Bradley | |
| 8,294,469 B2 | 10/2012 | Bradley | |
| 8,498,582 B1 | 7/2013 | Bradley | |
| 8,666,322 B1 | 3/2014 | Bradley | |
| 8,816,672 B1 | 8/2014 | Bradley | |
| 8,903,324 B1 | 12/2014 | Bradley | |
| 9,037,101 B1 * | 5/2015 | Somashekar | H04W 4/22 455/114.2 |
| 2002/0030871 A1 | 3/2002 | Anderson | |
| 2002/0094785 A1 | 7/2002 | Deats | |
| 2003/0232600 A1 | 12/2003 | Montgomery | |
| 2005/0141602 A1 | 6/2005 | Hyun | |
| 2006/0202900 A1 | 9/2006 | Simile | |
| 2009/0096466 A1 | 4/2009 | Delforce | |
| 2009/0124122 A1 | 5/2009 | Stanford | |
| 2009/0125253 A1 | 5/2009 | Blair | |
| 2010/0029553 A1 | 2/2010 | Scheibel | |
| 2010/0052652 A1 | 3/2010 | Mitchell | |
| 2010/0085061 A1 | 4/2010 | Bradley | |
| 2010/0164504 A1 | 7/2010 | Bradley | |
| 2010/0194382 A1 | 8/2010 | Montena | |
| 2010/0295533 A1 | 11/2010 | Kuga | |
| 2012/0086612 A1 | 4/2012 | Linehan | |
| 2013/0071112 A1 | 3/2013 | Melester | |
| 2013/0182753 A1 * | 7/2013 | Delforce | H04B 17/0085 375/228 |
| 2014/0146866 A1 | 5/2014 | Strachan | |
| 2015/0009283 A1 * | 1/2015 | Ferrer Zaera | H04L 5/1423 348/14.12 |

OTHER PUBLICATIONS

Lui, Passive Intermodulation Interference in Communication Systems, Jun. 1990, pp. 109-118, vol. 2, Issue 3, Electronics & Communication Engineering Journal.

Eron, PIM Requirements for Low Power Wireless Components and Subsystems, White Paper, 4 pages, Microlab.

Hartman, et al., PIM Test Power Levels for Mobile Communications Systems, 2012, 8 pages, Kaelus.

Holzman, Essentials of RP and microwave grounding, Chapter 4: Transmission Line Transitions, 2006, 31 pages, Artech House, Inc.

* cited by examiner

PULSE MODULATED PASSIVE INTERMODULATION (PIM) MEASURING INSTRUMENT WITH REDUCED NOISE FLOOR

BACKGROUND

Technical Field

The present invention relates generally to systems and methods for measuring passive intermodulation (PIM).

Related Art

Passive intermodulation (PIM), resulting from the non-linear mixing of two or more frequencies in a passive device such as a connector or cable, can be problematic for operators of wireless communication systems. PIM can appear, for example, as existing equipment ages, when new carriers are co-located, when new carriers are overlaid (diplexed) into old antenna runs, and when new equipment is installed. In a cellular network, PIM creates interference that can reduce a receive sensitivity of a cell or block calls. This interference can affect the cell that creates it, as well as other nearby receivers. PIM can be a serious issue for operators of wireless communication systems wanting to maximize a system's reliability, data rate, capacity, and return on investment.

High-speed digital data communications have further increased the problematic nature of PIM. PIM has surfaced as a problem for wireless data transmission using modern standards including Long-Term Evolution (LTE), Global System for Mobile Communications (GSM), Advanced Wireless Service (AWS) and Personal Communication Service (PCS) standards. As cell usage and throughput grow, the peak power produced by new digital modulations increases dramatically, potentially contributing heavily to PIM problems. On-site experiments have shown significant decreases in download speeds linked to slight increases in PIM. For example, drive tests have revealed an approximate 18% drop in download speed when residual PIM level is increased from −125 dBm to −105 dBm.

PIM can be reduced or eliminated by replacing or correcting sources of PIM, including faulty cables or connectors. Test systems can be utilized to detect PIM in a communication system and enable a technician to locate the source of the detected PIM. A test system to measure PIM will typically create signals at two (or more) different frequencies, amplify them and provide them, for example, through cables connecting base stations to antennas for transmitting and receiving signals. A return signal carrying PIM is filtered to select a desired test frequency harmonic where PIM is detectable, and measurements of the magnitude of a PIM and the distance-to-PIM are provided to the technician of the test system.

SUMMARY OF THE INVENTION

In an embodiment, a method for calculating passive intermodulation (PIM) associated with a device under test (DUT) includes generating a test signal using a measuring instrument and obtaining measurements of PIM generated at the DUT. The test signal comprises two or more tones each amplified to a target output power by a respective amplifier according to a duty cycle. Measurements are obtained by the measuring instrument during an active portion of each duty cycle over a sweep of frequencies. PIM is calculated for the DUT by averaging a plurality of measurements obtained for each frequency from the sweep of frequencies. The duty cycle is determined based on the target output power. In an embodiment, the duty cycle is further determined based on a receiver sensitivity of the measuring instrument. In an embodiment, the duty cycle is determined using an equation or a look-up table. The determination of duty cycle varies inversely with the target output power. In an embedment, the determination of duty cycle is varied with the target output power so that an average power consumed by the measuring instrument is approximately constant.

In an embodiment, a measuring instrument for performing methods in accordance with the present invention includes a signal generator for generating test signals and a computer readable non-transitory storage medium and processor operating thereon, wherein the computer readable non-transitory storage medium includes instructions for measuring PIM generated at a DUT. The computer readable non-transitory storage medium further includes instructions that when executed in response to user input cause the measuring instrument to generate a test signal comprising two or more tones each amplified to a target output power by a respective amplifier according to a duty cycle, obtain measurements of PIM during an active portion of each duty cycle over a sweep of frequencies and calculate PIM associated with the DUT by averaging a plurality of measurements obtained for each frequency from the sweep of frequencies. The duty cycle is determined based on the target output power.

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. Like parts or elements may be described in a single embodiment, or they may be described in multiple embodiments.

Figure 1:
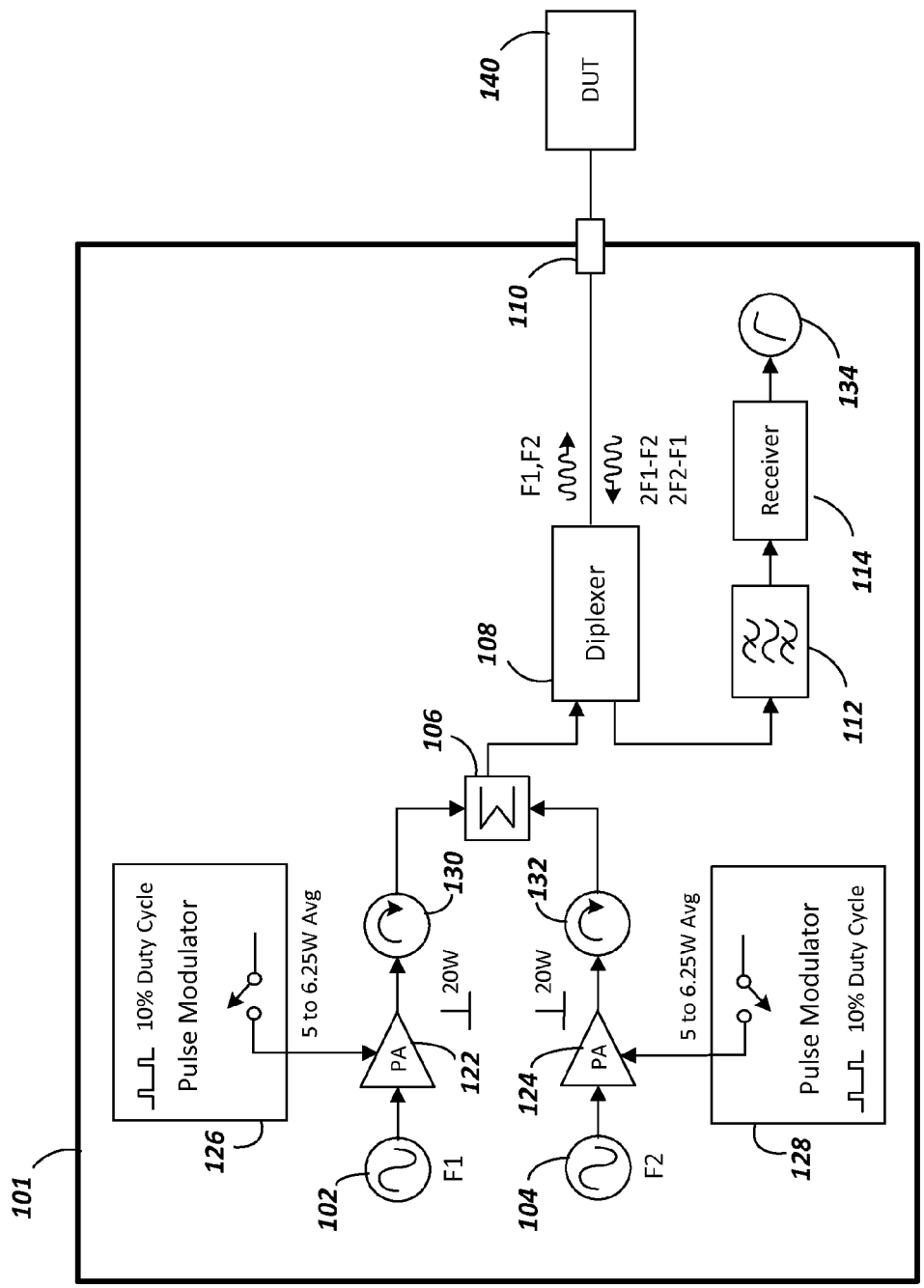
FIG. 1 illustrates a measuring instrument for obtaining measurements of passive intermodulation (PIM) produced at a device under test (DUT).

FIG. 1 is a simplified, block diagram of an instrument 101 usable for measuring PIM (referred to hereinafter as a measuring instrument). The measuring instrument comprises two signal sources, with a first signal source 102 generating a first tone at frequency F1 and a second signal source 104 generating a second tone at frequency F2. The first tone is amplified by a first power amplifier 122 while the second tone is amplified by a second power amplifier 124. The power amplifiers receive power from a direct current (DC) power supply to amplify the first and second tones to up to 40 W (or more). The tones generated by the signal sources and amplified by the power amplifiers are provided to a combiner 106 to create a test signal with the carrier frequencies F1 and F2 at the combiner output. The combiner isolates the two tones at an input so that intermodulation is not produced by power output stage nonlinearities. Isolators 130, 132 provide additional isolation from any return signal from the combiner 106. A diplexer 108 passes the combined signal to a test port 110 connectable with a device, system and/or network (referred to hereinafter as a device-under-test (DUT)) 140.

Unwanted signals related to PIM sources can be generated when multiple frequency components are allowed to share the same signal path in a nonlinear transmission medium. Where the DUT includes a PIM source, a reflected signal (also referred to as a reverse signal) is generated and returned to the measuring instrument. The unwanted signals can include components at multiple different frequencies predictable using a pair of formulas including the expressions $nF1-mF2$ and $nF2-mF1$, where F1 and F2 are the carrier frequencies and the constants n and m are positive integers. Generally the components of concern are the third, fifth and seventh order components. The third order response can be particularly problematic, resulting in the highest power components at frequencies $2F1-F2$ as well as $2F2-F1$.

A reflected signal received by the measuring instrument is mixed, down converted and filtered (with components combined in block 112 for simplification) to obtain an intermediate frequency (IF) signal. The IF signal is amplified, the magnitude of the IF signal is detected by a receiver 114 and a measurement of PIM 134 is obtained. Components of the measuring instrument can contribute delay to measurements, preventing a usable determination of the distance to the PIM source from the measuring instrument. For example, the filters of the measuring instrument can contribute a group delay that has associated with it an uncontrollable length substantial enough to corrupt a measurement of PIM. However, a reference PIM source (not shown, also referred to herein as a calibration standard) can be used with the measuring instrument to enable the measuring instrument to locate a PIM source relative to the measuring instrument, for example as described in U.S. Pat. No. 8,666,322 to Bradley et al., entitled "System and Method for Measuring and Locating Passive Intermodulation (PIM) Sources in a Network and/or Device.", incorporated herein by reference.

It is not possible to predict the magnitude of PIM that will be generated at one power level based on the known PIM at a different power level. However, measurements of PIM are power sensitive, and due to the somewhat random characteristics of nonlinear junctions, PIM levels produced by a nonlinear junction typically increase between 2.2 dB to 2.8 dB for every 1 dB increase in test power. Many operators have adopted the practice of generating two 20 W tones for performing measurements of PIM at cell sites. As a result, output power of a measuring instrument has been standardized to two 20 W tones for PIM testing and acceptance criteria for cables, connectors and antennas.

The power supplied to the power amplifiers by the DC power supply to output two 20 W tones can be substantial due to inefficiencies of the power amplifiers and losses through components of the measuring instrument. Power consumption of the measuring instrument can be reduced through the use of pulse width modulators 126 and 128, each associated with a power amplifier. The pulse width modulators are synchronized to switch the power amplifiers on and off, drawing power from the DC power supply when the power amplifiers are switched on. A duty cycle for the pulse width modulators is selected to set the DC power consumption. As used herein, the duty cycle refers to a percentage of one period in which the amplifier is switched on, wherein a period is the time it takes for a switch to complete an on-and-off cycle. Measurements of PIM can be obtained during the on time of the power amplifiers. Processing and display can be performed in the off time of the power amplifiers when measurements of PIM will not be available.

A measuring instrument can be used to perform swept measurements whereby one (or both) of the frequencies F1, F2 is swept. PIM generated by PIM sources in response to the swept frequency will likewise be swept, varying with time. Single sweep measurements can be made if the time before the next measurement is held off to maintain the duty cycle. The only user observation will be a slower sweep. The off time can, thus, be accomplished in a manner substantially transparent to the user.

A calculation of PIM based on pulsed measurements relies on a compromise of output power measurement time, battery life and receiver noise enhancement using averaging. A typical calculation of PIM, for example, can rely on pulsed measurements using a test signal generated by the measuring instrument with a peak output power of 20 W per tone with a duty cycle having an on time of 1.5 ms and an off time of 22 ms (i.e., a duty cycle of approximately 6%). The 1.5 ms on time can include 0.5 ms for bringing the power amplifiers to full power and 1 ms for the actual measurement. A 6% duty cycle is a compromise between sweep speed, noise floor and battery power drain (i.e., operating lifetime). A 6% duty cycle can reduce the total average power consumption to 6% of the amount of power consumed by the measuring instrument with the power amplifier in an always-on state without modulating peak output power. A measuring instrument performing such a pulsed measurement can consume an average DC power of 8.9 W while performing a 200 point sweep taking 4.8 s.

In recent years, wireless communication systems have taken advantage of lower power wireless networks supplementing higher power wireless networks, such as cellular networks, to increase service coverage. For example, distributed antenna system (DAS) networks have seen an exponential growth in demand for use inside buildings, across campuses, inside sports arenas, within congested downtown areas, and inside rail and subway systems. A DAS network includes a group of small antennas, or "nodes", working together to transmit wireless signals to improve coverage and reliability in areas where traditional wireless signal sources, such as cell towers, have trouble reaching users. However, whereas a cell tower transmits at high powers over a large geographic area to provide limited coverage to a multitude of users, each antenna in the DAS network serves as a "mini" cell tower transmitting at lower powers with improved signal strength and bandwidth over a much smaller area to only a few users.

During deployment, the antennas of a DAS network are tuned to precisely match the areas of a building or venue where boosted service is needed. As demand has grown, problems related to deploying a DAS network have also increased, due in large part to interference related to PIM. A DAS antenna and the indoor environment in which it is deployed can generate PIM orders of magnitude larger than a high power antenna due to their location, for example mounted on ceilings within building. Features such as sprinkler heads and false ceiling hangers are possible sources of PIM. Measuring instruments configured for measuring PIM, such as described above for example, are usable to measure PIM generated within DAS networks, within components of DAS networks and/or within an environment in which the DAS network is deployed. However, DAS networks require lower power testing on the order of 100 mW per tone. Receiver noise floor and sensitivity for measurements at these power levels become emphasized relative to measurements at higher powers, such as used for testing the high power outdoor antennas.

If the output power of a standard 6% duty cycle measuring instrument that typically outputs two 20 W tones (i.e., 2×20 W) were lowered to approach the operating levels of a DAS network, battery power consumed by the measuring instrument would be miniscule due to the lower output power while sweep time would remain the same. Table 1 provides examples of the average DC power consumed (P Avg. DC) by a typical measuring instrument, such as described above, as output power of the generated tones (Power Out per tone) drops, while the average on time (t_on) and off time (t_off) (i.e., the duty cycle) remain constant such that two hundred individual measurements (Averages) are obtained and averaged to calculate PIM.

TABLE 1

| Power Out per tone | P Avg. DC | t_on | t_off | Averages |
|---|---|---|---|---|
| +46 dBm (40 W) | 17.9 W | 1.5 ms | 22 ms | 200 |
| +43 dBm (20 W) | 8.9 W | 1.5 ms | 22 ms | 200 |
| +40 dBm (10 W) | 4.7W | 1.5 ms | 22 ms | 200 |
| +37 dBm (5 W) | 2.2 W | 1.5 ms | 22 ms | 200 |
| +34 dBm (2.5 W) | 1.1 W | 1.5 ms | 22 ms | 200 |
| +33 dBm (2 W) | 0.9 W | 1.5 ms | 22 ms | 200 |
| +31 dBm (1.25 W) | 0.6 W | 1.5 ms | 22 ms | 200 |

However, the above described measuring instrument that typically operates at 2×20 W with a 6% duty cycle would not have sufficient receiver sensitivity if the output power were simply lowered to approach the operating levels of a DAS network. It has been observed by the inventor that better sensitivity can be obtained in a calculation of PIM using pulsed measurements by increasing the averaging of measurements, thereby reducing the noise floor by 10 log N, where N represents the number of averages (i.e., the number of pulsed measurements averaged in a calculation of PIM). That is to say that the noise bandwidth (BW) is approximately the inverse of average on time, or BW (Hz)=1/average on time Increasing average on time by a factor of ten can increase the number of averages to decrease the noise floor by approximately 10 dB.

Systems and methods in accordance with embodiments can be used to increase receiver sensitivity and reduce the noise floor in a calculation of PIM based on pulsed measurements obtained using a measuring instrument. Table 2 provides examples of the expected average DC power consumed (P Avg. DC) by a typical measuring instrument, such as described above, as output power of the generated tones (Power Out per tone) drops, while the average on time (t_on) and off time (t_off) (i.e., the duty cycle) is varied to increase the number of individual measurements (Averages) that are obtained and averaged to calculate PIM, as well as the noise floor reduction (Noise drop) for the measurement of PIM.

TABLE 2

| Power Out per tone | P Avg. DC | t_on | t_off | Averages | Noise drop |
|---|---|---|---|---|---|
| +46 dBm (40 W) | 17.9 W | 1.5 ms | 22 ms | 200 | -- |
| +43 dBm (20 W) | 8.9 W | 1.5 ms | 22 ms | 200 | -- |
| +40 dBm (10 W) | 8.9 W | 3.0 ms | 20.5 ms | 500 | 4 dB |
| +37 dBm (5 W) | 8.9 W | 6.0 ms | 17.5 ms | 1100 | 7.4 dB |
| +34 dBm (2.5 W) | 8.9 W | 12.0 ms | 11.5 ms | 2300 | 10.6 dB |
| +33 dBm (2 W) | 8.9 W | 15.0 ms | 8.5 ms | 2900 | 11.6 dB |
| +31 dBm (1.25W) | 8.9 W | 23.5 ms | 0 ms | 4600 | 13.6 dB |

In an embodiment, the sweep speed and the DC power consumed by the measuring instrument performing a pulsed measurement of PIM at low output powers is generally maintained relative to a pulsed measurement of PIM at high output power by varying the duty cycle to increase the number of averages, with the result being a reduction in the noise floor of the measuring instrument and increased receiver sensitivity. A technician or other user of the measuring instrument thus will not experience unexpected performance of the measuring instrument in terms of battery life or sweep time, but will obtain better measurements of PIM and PIM location, potentially improving the speed and ability with which the technician or other user can locate and correct sources of PIM related to a DUT. The variation in duty cycle can be transparent to the technician or other user, who may have an intuitive expectation of measuring instrument batter performance.

In other embodiments, the duty cycle applied to a pulse measurement of PIM need not necessarily be determined such that the average DC power consumed is substantially the same for tones generated at different output powers. However, it can be preferable that the average DC power consumed for tones generated at lower powers be approximately the same or lower so that an expectation of battery life of a measuring instrument by a technician or other user is at least met. In other embodiments, a duty cycle applied to a pulse measurement of PIM can be determined based on variables including a targeted output power per tone generated by the measuring instrument, a targeted average DC power consumed by the measuring instrument, a targeted reduction in noise floor of the measuring instrument, an expected PIM profile of a targeted DUT, or some combination of two or more of these variables.

In an embodiment, the duty cycle can be determined based on a look-up table stored in memory on the measuring instrument, for example, or an equation programmed into the measuring instrument. In an embodiment, the duty cycle can be set by a technician or other user, by selecting on the measuring instrument a "low power mode" or a "DAS mode", for example, which selected mode determining and setting the appropriate target output power and duty cycle. Alternatively, the technician or other user can enter the output power and the duty cycle directly, for example in response to a prompt by the measuring instrument, via a physical look-up table or chart accessible to the technician or other user.

Figure 2:
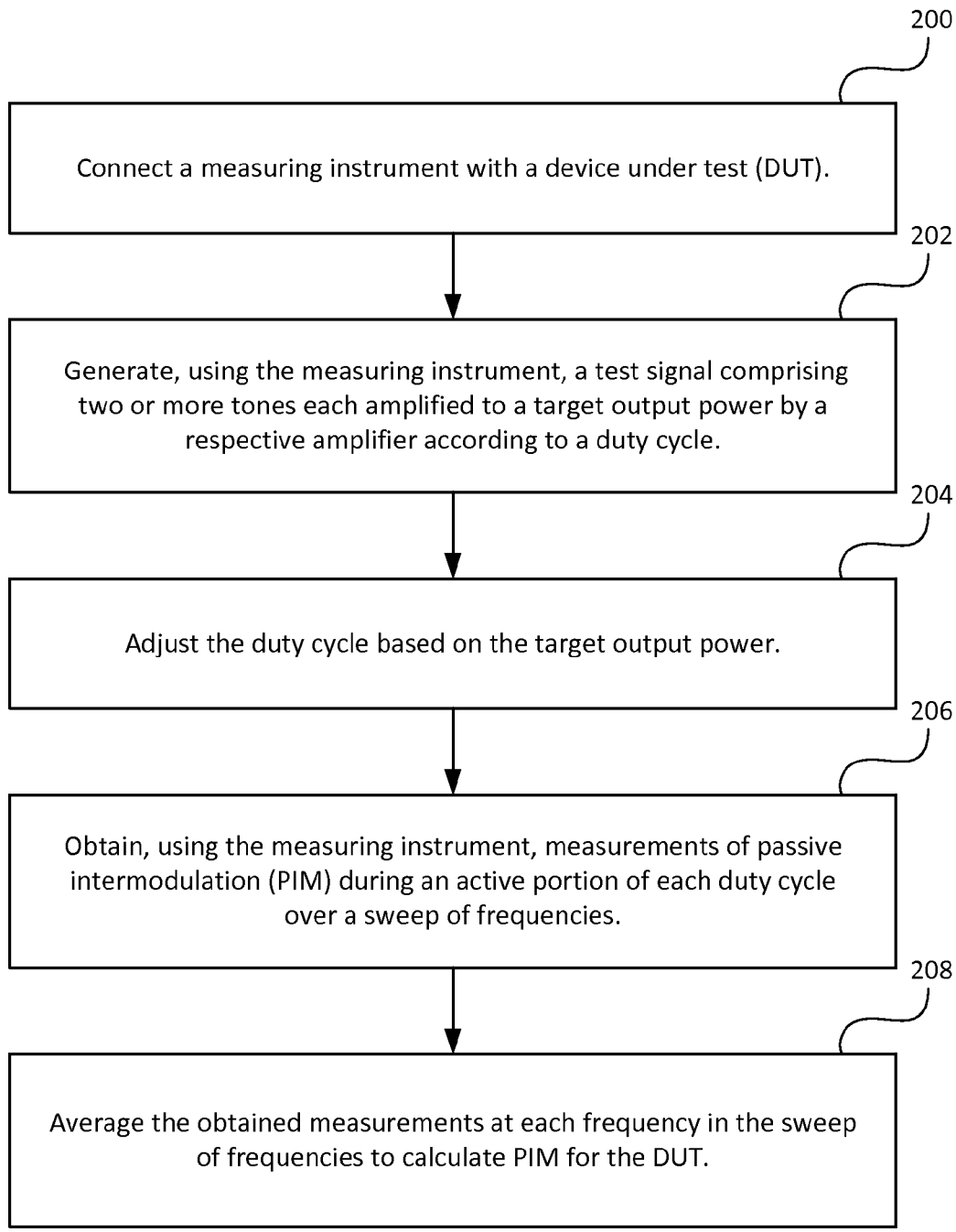
FIG. 2 is a flow chart for a method of measuring PIM produced at a DUT in accordance with an embodiment.

FIG. 2 is a flowchart of a method of measuring PIM produced at a DUT in accordance with an embodiment. A measuring instrument, for example as described above, is connected with a DUT that has a low operating power, such as a DAS network (Step 200). A test signal can be generated using the measuring instrument, the test signal comprising two or more tones each amplified to a target output power by a respective amplifier according to a duty cycle (Step 202). The duty cycle is determined based on the target output power and adjusted (if the duty cycle is not already properly set) (Step 204). As described above, the duty cycle can be determined based on one or more variables including, in an embodiment, the average DC power consumption of the measuring instrument, so that the number of measurements obtained at any given frequency can be increased to improve an average measurement and reduce a noise floor of the measuring instrument. Measurements of PIM are then obtained using the measuring instrument during an active portion of each duty cycle over a sweep of frequencies (Step 206). A calculation of PIM for the DUT can then be obtained (and provided to a technician or user) by averaging, for each frequency, the obtained measurements (Step 208).

It is noted that embodiments of systems and measuring instruments for performing methods described herein may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

In some embodiments, the measuring instrument includes a computer program product which is a storage medium or computer readable medium (media) having instructions stored thereon/in which can be used to program a computer to perform any of the processes and methods of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for calculating passive intermodulation (PIM) associated with a device under test (DUT) using a measuring instrument configured to generate test signals, the method comprising:
    generating, using the measuring instrument, a test signal comprising two or more tones each amplified to a target output power by a respective amplifier according to a duty cycle;
    wherein the duty cycle is selected based on a target average power consumption of the measuring instrument;
    obtaining, using the measuring instrument, a plurality of measurements of PIM over a sweep of frequencies, wherein a measurement of PIM is obtainable during an active portion of a period determined by the duty cycle;
    calculating PIM associated with the DUT by averaging a plurality of measurements of PIM obtained for each frequency from the sweep of frequencies; and
    upon reducing the target output power of the two or more tones, increasing the duty cycle to thereby increase measurements of PIM for each frequency from the sweep of frequencies;
    wherein the duty cycle is increased such that average power consumption of the measuring instrument is at or below the target average power consumption.

2. The method of claim 1, wherein the duty cycle is selected using one of a formula and a look-up table.

3. The method of claim 1, wherein the duty cycle is further selected based on a receiver sensitivity of the measuring instrument.

4. The method of claim 1, wherein the duty cycle is varied inversely and linearly with the target output power of the two or more tones.

5. The method of claim 1, wherein the duty cycle is selected so that, for a range of target output powers, the average power consumption of the measuring instrument for generating the test signal is substantially constant as target output power is varied.

6. A measuring instrument for calculating passive intermodulation (PIM) associated with a device under test (DUT), the system comprising:
    a signal generator for generating test signals;
    a computer readable non-transitory storage medium and processor operating thereon, wherein the computer readable non-transitory storage medium includes instructions that when executed in response to user input cause the measuring instrument to
        generate a test signal comprising two or more tones each amplified to a target output power by a respective amplifier according to a duty cycle,
        wherein the duty cycle is selected based on a target average power consumption of the measuring instrument;
        obtain a plurality of measurements of PIM over a sweep of frequencies, wherein a measurement of PIM is obtainable during an active portion of a period determined by the duty cycle;
        calculate PIM associated with the DUT by averaging a plurality of measurements of PIM obtained for each frequency from the sweep of frequencies; and
        upon reducing the target output power of the two or more tones, increasing the duty cycle to thereby increase measurements of PIM for each frequency from the sweep of frequencies;
        wherein the duty cycle is increased such that average power consumption of the measuring instrument is at or below the target average power consumption.

7. The measuring instrument of claim 6, wherein the duty cycle is selected using one of a formula and a look-up table.

8. The measuring instrument of claim 6, wherein the duty cycle is further selected based on a receiver sensitivity of the measuring instrument.

9. The method of claim 6, wherein the duty cycle is selected so that, for a range of target output powers, the average power consumption of the measuring instrument for generating the test signal is substantially constant as target output power is varied.

10. A method for measuring passive intermodulation (PIM) associated with a device under test (DUT) using a measuring instrument configured to generate test signals, the method comprising:
    performing a measurement of PIM, using the measuring instrument, by generating a test signal comprising two or more tones each amplified by an amplifier to have a first target output power;
    wherein the amplifiers consume direct current (DC) power to amplify the two or more tones;
    switching the amplifiers on or off according to a duty cycle;
    wherein an average DC power is consumed over the duty cycle; and reducing a noise floor of the measuring instrument by reducing the first target output power of the two or more tones to a second target output power, and increasing the duty cycle;

wherein the duty cycle is increased such that the average DC power consumed by the amplifiers to amplify the two or more tones to the second target output power is approximately the same as the average DC power consumed by the amplifiers to amplify the two or more tones to the first target output power.

11. The method of claim 10, wherein the duty cycle is selected using one of a formula and a look-up table based on the target output power.

12. The method of claim 10, wherein the duty cycle is further selected based on a receiver sensitivity of the measuring instrument.

13. The method of claim 1, further comprising processing measurements and displaying results when the respective amplifier of each tone is inactive.

14. The measuring instrument of claim 6, wherein the computer readable non-transitory storage medium includes instructions that cause the measuring instrument to process measurements and display results when the respective amplifier of each tone is inactive.

15. The method of claim 10, further comprising processing measurements and displaying results when the respective amplifier of each tone is inactive.

16. The method of claim 1, wherein the duty cycle is one of
selected automatically by the measuring instrument, and
selected manually by a user of the measuring instrument.

17. The measuring instrument of claim 6, wherein the computer readable non-transitory storage medium includes instructions that one of
automatically selects the duty cycle, and
receives the duty cycle selected manually by a user of the measuring instrument.

* * * * *